US012763776B1

(12) United States Patent
Banik et al.

(10) Patent No.: US 12,763,776 B1
(45) Date of Patent: Oct. 13, 2026

(54) LEVEL SHIFTING CIRCUIT WITH INTEGRATED LATCH

(71) Applicant: M31 TECHNOLOGY CORPORATION, Hsinchu County (TW)

(72) Inventors: Saikat Kumar Banik, Hsinchu County (TW); Anoop Delampady, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 19/174,981

(22) Filed: Apr. 10, 2025

(51) Int. Cl.
*H03K 19/0185* (2006.01)

(52) U.S. Cl.
CPC ............................ *H03K 19/018528* (2013.01)

(58) Field of Classification Search
CPC ... H03K 19/018514; H03K 19/018521; H03K 19/018528
USPC .......................................................... 327/333
See application file for complete search history.

(56) References Cited

U.S. PATENT DOCUMENTS 6,351,173 B1 * 2/2002 Ovens .............. H03K 3/356156 327/333
7,295,056 B2 * 11/2007 Tanaka ................. H03K 17/223 327/333
8,559,247 B2 * 10/2013 Shiu ....................... G11C 7/225 365/189.11
8,638,121 B2 * 1/2014 Suzuki ............... H03K 3/35613 327/333
9,553,585 B1 * 1/2017 Song .............. H03K 19/018528
9,934,845 B2 4/2018 Yang et al.
2006/0290404 A1 * 12/2006 Law ....................... H03K 3/012 327/333
2008/0204078 A1 * 8/2008 O .................. H03K 19/018528 326/81
2008/0238514 A1 * 10/2008 Kim .......................... G06F 1/08 327/212
2018/0083629 A1 * 3/2018 Bringivijayaraghavan ................ G11C 11/418
2020/0052678 A1 * 2/2020 Chen .............. H03K 19/018521
2020/0252068 A1 * 8/2020 Raychaudhuri .. H03K 3/356113
2021/0336609 A1 10/2021 Chen et al.
2024/0396534 A1 11/2024 Gong et al.
2026/0066904 A1 * 3/2026 Labrecque ....... H03K 3/356017

OTHER PUBLICATIONS

Office Action issued by Taiwan Intellectual Property Office on Apr. 21, 2026.

* cited by examiner

*Primary Examiner* — William Hernandez
(74) *Attorney, Agent, or Firm* — WPAT, PC

(57) ABSTRACT

A level shifting circuit includes a front stage and a rear stage. The front stage and the rear stage are operated according to a first clock and a second clock. During a first phase of the first clock, the front stage is in a conversion mode, the rear stage is in a propagation mode, and the front stage is served as a level shifter. Furthermore, the input signal between a first supply voltage and a ground voltage is converted into a shifted signal between a second supply voltage and the ground voltage. During a second phase of the first clock, the front stage is in a tri-state output mode, the rear stage is in a retention mode, and the rear stage is served as a latch. Furthermore, the output signal from the rear stage is maintained at a specified logic level.

17 Claims, 10 Drawing Sheets

LEVEL SHIFTING CIRCUIT WITH INTEGRATED LATCH

FIELD OF THE INVENTION

The present invention relates to a circuit, and more particularly to a level shifting circuit with an integrated latch.

BACKGROUND OF THE INVENTION

In the architecture of a dual rail SRAM, two different supply voltages are provided to the SRAM. Generally, the dual rail SRAM includes a peripheral control circuit and a memory cell array. The memory cell array is composed of a plurality of memory cells. In the dual rail SRAM, a first supply voltage is provided to the peripheral control circuit, and a second supply voltage is provided to the memory cell array. The first supply voltage is less than the second supply voltage.

In the above types of circuits, the logic level for the peripheral control circuit and the logic level for the memory cell array are different. Consequently, it is necessary to design a level shifter to perform logic level conversion between different supply voltages. In other words, each IO pin of the circuit needs to be connected to a level shifter. Consequently, the more IO pins there are in the circuit, the more converters are needed.

For example, U.S. Pat. No. 9,934,845 discloses a latch with a built-in level shifter, which is used in a similar dual rail SRAM.

As is well known, all of the IC chips for IoT applications or high-density applications include SRAMs inside. To provide a circuit with low power and area is the purpose of the present invention.

SUMMARY OF THE INVENTION

An embodiment of the present invention provides a level shifting circuit with an integrated latch. The level shifting circuit includes a front stage and a rear stage. An input terminal of the front stage is arranged to receive an input signal. A first clock terminal of the front stage is arranged to receive a first clock. A second clock terminal of the front stage is arranged to receive a second clock. The first clock and the second clock are complementary to each other. The first clock is at a first level during a first phase. The first clock is at a second level during a second phase. An input terminal of the rear stage is connected to an output terminal of the front stage. A first clock terminal of the rear stage is arranged to receive the first clock. A second clock terminal of the rear stage is arranged to receive the second clock. An output terminal of the rear stage is arranged to generate an output signal. During the first phase, the front stage is in a conversion mode, the rear stage is in a propagation mode, and the front stage serves as a level shifter. The input signal in a range between a first supply voltage and a ground voltage is converted into a shifted signal in a range between a second supply voltage and the ground voltage by the front stage. The rear stage is configured to receive the shifted signal and generate the output signal. The first supply voltage is lower than the second supply voltage. During the second phase, the front stage is in a tri-state output mode, the rear stage is in a retention mode, and the rear stage serves as a latch. The output terminal of the front stage has a high output impedance. The output signal from the rear stage is maintained at a specified logic level and kept unchanged.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a level shifting circuit with an integrated latch. The manufacturing process of the level shifting circuit is compatible with the existing CMOS process and suitably applied to the architecture of a dual rail SRAM.

Figure 1:
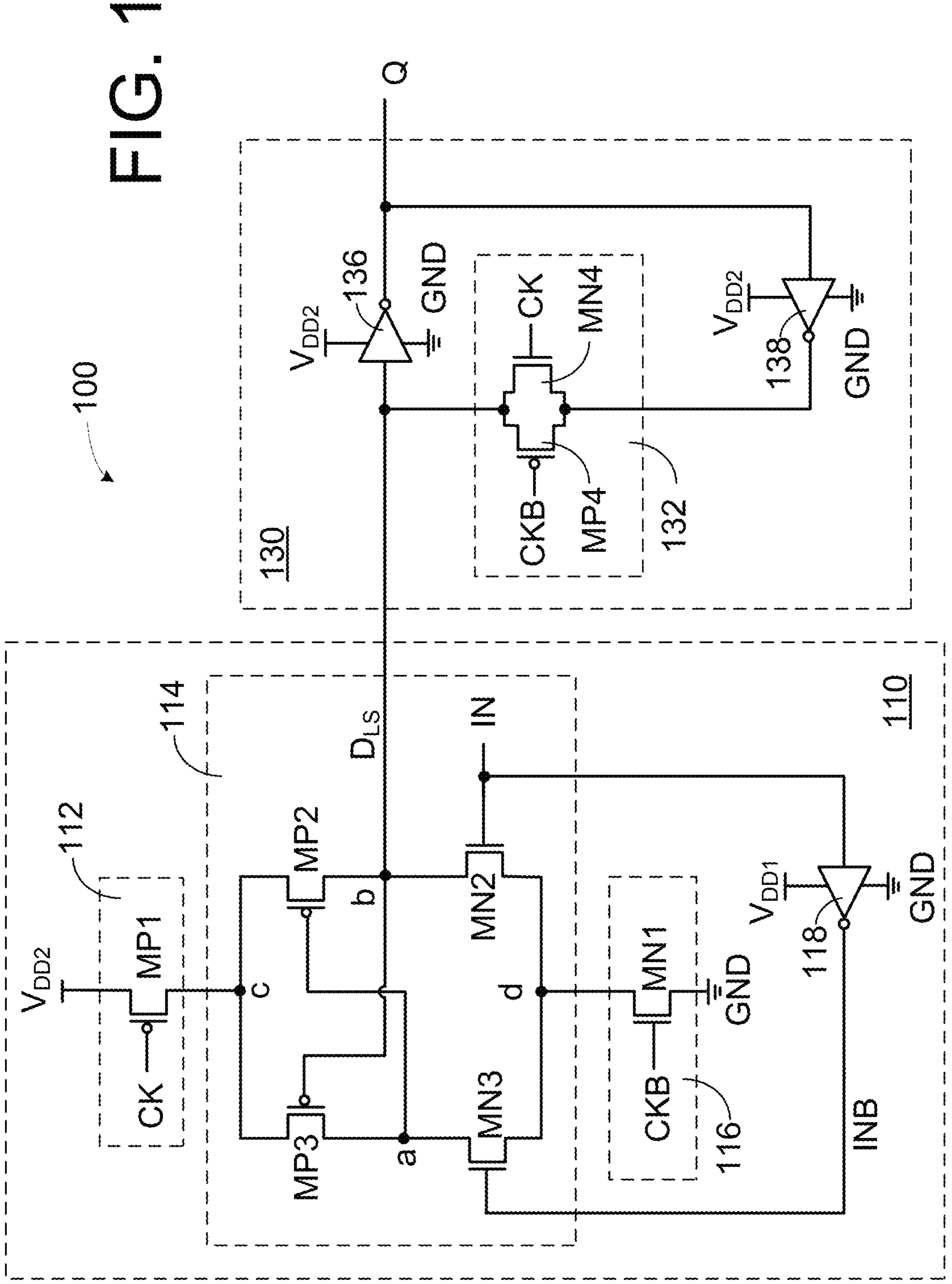
FIG. 1 is a schematic circuit diagram illustrating a level shifting circuit with an integrated latch according to a first embodiment of the present invention.

FIG. 1 is a schematic circuit diagram illustrating a level shifting circuit with an integrated latch according to a first embodiment of the present invention. For brevity, the level shifting circuit with the integrated latch is referred to as the level shifting circuit 100.

The level shifting circuit 100 includes a front stage 110 and a rear stage 130. The two clock terminals of the front stage 110 receive a first clock CK and a second clock CKB, respectively. The input terminal of the front stage 110 receives an input signal IN. The output terminal of the front stage 110 generates a shifted signal $D_{LS}$. The first clock CK and the second clock CKB are complementary to each other.

The two clock terminals of the rear stage 130 receive the first clock CK and the second clock CKB, respectively. The input terminal of the rear stage 130 is connected to the output terminal of the front stage 110 to receive the shifted signal $D_{LS}$. The output terminal of the rear stage 130 generates an output signal Q.

The first clock CK is at a first level during a first phase. The first clock CK is at a second level during a second phrase. Furthermore, during the operation of the level shifting circuit 100, the first phase and the second phase will continue to switch. In this embodiment, the first level of the first clock CK is a low level, and the first phase is a clock low phase. In addition, the second level of the first clock CK is a high level, and the second phase is a clock high phase.

The front stage 110 can be selectively operated in one of two operation modes. That is, the front stage 110 can be selectively operated in a tri-state output mode or a conversion mode. For example, during the clock high phase, the front stage 110 is in the tri-state output mode. That is, the output terminal of the front stage 110 has a high output impedance. During the clock low phase, the front stage 110 is in the conversion mode. In the conversion mode, a logic level conversion is performed on the input signal IN by the front stage 110, and the shifted signal $D_{LS}$ is outputted from the output terminal of the front stage 110.

Similarly, the rear stage 130 can be selectively operated in one of two operation modes. That is, the rear stage 130 can be selectively operated in a propagation mode or a retention mode. For example, during the clock low phase, the front stage 110 is in the conversion mode, and the rear stage 130 is in the propagation mode. Under this circumstance, the input signal IN received by the front stage 110 will be propagated to the output terminal of the rear stage 130 and served as the output signal Q. That is, the front stage 110 converts the input signal IN into the shifted signal $D_{LS}$, and the rear stage 130 receives the shifted signal $D_{LS}$ and generates the output signal Q. During the clock high phase, the front stage 110 is in the tri-state output mode, and the rear stage 130 is in the retention mode. That is, during the clock high phase, the output terminal of the front stage 110 has the high output impedance. And, the output signal Q from the rear stage 130 is maintained at a specific logic level and kept unchanged.

When the logic level of the input signal IN is subjected to a change during the clock low phase, the logic level of the output signal Q will be correspondingly changed. Whereas, when the logic level of the input signal IN is subjected to a change during the clock high phase, the logic level of the output signal Q is kept unchanged.

The detailed circuitry structure of the level shifting circuit 100 of the first embodiment will be described as follows. As shown in FIG. 1, the front stage 110 includes a header switch 112, a converter 114, a footer switch 116 and an inverter 118.

The inverter 118 is a CMOS inverter, and the inverter 118 can be composed of two transistors. The two power terminals of the inverter 118 receive a first supply voltage $V_{DD1}$ and a ground voltage GND, respectively. The input terminal of the inverter 118 is connected to the input terminal of the front stage 110 to receive the input signal IN. The output terminal of the inverter 118 generates an inverted signal of the input signal IN, i.e., an inverted input signal INB. The logic high level of the input signal IN is the first supply voltage $V_{DD1}$, and the logic low level of the input signal IN is the ground voltage GND. Similarly, the logic high level of the inverted input signal INB is the first supply voltage $V_{DD1}$, and the logic low level of the inverted input signal INB is the ground voltage GND.

The first terminal of the header switch 112 receives a second supply voltage $V_{DD2}$. The second terminal of the header switch 112 is connected to a node c. The control terminal of the header switch 112 receives the first clock CK. As shown in FIG. 1, the header switch 112 includes a transistor MP1. The first terminal of the transistor MP1 receives the second supply voltage $V_{DD2}$. The second terminal of the transistor MP1 is connected to the node c. The control terminal of the transistor MP1 receives the first clock CK. For example, the first terminal of the transistor MP1 is a first drain/source terminal of the transistor MP1, the second terminal of the transistor MP1 is a second drain/source terminal of the transistor MP1, and the control terminal of the transistor MP1 is a gate terminal of the transistor MP1. The second supply voltage $V_{DD2}$ is greater than the first supply voltage $V_{DD1}$. Note that the proposed level shifting scheme can provide low-voltage and wide-range level shifting. For example, the first supply voltage $V_{DD1}$ is 480 mV, and the second supply voltage $V_{DD2}$ is 840 mV, meaning that the level shifting circuit 100 can achieve a level shift of 360 mV.

The first terminal of the footer switch 116 is connected to a node d. The second terminal of the footer switch 116 receives the ground voltage GND. The control terminal of the footer switch 116 receives the second clock CKB. For example, the footer switch 116 includes a transistor MN1. The first terminal of the transistor MN1 is connected to the node d. The second terminal of the transistor MN1 receives the ground voltage GND. The control terminal of the transistor MN1 receives the second clock CKB.

The converter 114 has a first input terminal, a second input terminal, an output terminal, a first power terminal and a second power terminal. The first power terminal of the converter 114 is connected to the node c. The second power terminal of the converter 114 is connected to the node d. The first input terminal of the converter 114 is connected to the input terminal of the front stage 110 for receiving the input signal IN. The second input terminal of the converter 114 is connected to the output terminal of the inverter 118 for receiving the inverted input signal INB. The output terminal of the converter 114 generates the shifted signal $D_{LS}$.

The converter 114 includes transistors MP2, MP3, MN2 and MN3. The first terminal of the transistor MP2 is connected to the node c. The second terminal of the transistor MP2 is connected to a node b. The control terminal of the transistor MP2 is connected to a node a. The first terminal of the transistor MP3 is connected to the node c. The second terminal of the transistor MP3 is connected to the node a. The control terminal of the transistor MP3 is connected to the node b. The first terminal of the transistor MN2 is connected to the node b. The second terminal of the transistor MN2 is connected to the node d. The control terminal of the transistor MN2 receives the input signal IN. The first terminal of the transistor MN3 is connected to the node a. The second terminal of the transistor MN3 is connected to the node d. The control terminal of the transistor MN3 receives the inverted input signal INB. The node b is the output terminal of converter 114 and also the output terminal of front stage 110. The voltage at the node b is the shifted signal $D_{LS}$.

The rear stage 130 includes a transmission gate 132, an inverter 136 and an inverter 138. The inverters 136 and 138 are CMOS inverters. The two power terminals of the inverter 136 receive the second supply voltage $V_{DD2}$ and the ground voltage GND, respectively. The input terminal of the inverter 136 is connected to the output terminal of the front stage 110 to receive the shifted signal $D_{LS}$. The output terminal of the inverter 136 generates the output signal Q. The two power terminals of the inverter 138 receive the second supply voltage $V_{DD2}$ and the ground voltage GND, respectively. The input terminal of the inverter 138 is connected to the output terminal of the inverter 136. The first terminal of the transmission gate 132 is connected to the output terminal of the inverter 138. The second terminal of the transmission gate 132 is connected to the input terminal of the inverter 136. The two control terminals of the transmission gate 132 receive the first clock CK and the second clock CKB, respectively. For example, the transmission gate 132 includes a transistor MP4 and a transistor MN4. The first terminal of the transistor MP4 is connected to the output terminal of the inverter 138. The second terminal of the transistor MP4 is connected to the input terminal of the inverter 136. The control terminal of the transistor MP4 receives the second clock CKB. The first terminal of the transistor MN4 is connected to the output terminal of the inverter 138. The second terminal of the transistor MN4 is connected to the input terminal of the inverter 136. The control terminal of the transistor MN4 receives the first clock CK.

The operations of the level shifting circuit 100 of the first embodiment will be described in more detail as follows. The first phase is the clock low phase. During the clock low phase, the first clock CK is at the low level, and the second clock CKB is at the high level. The second phase is the clock high phase. During the clock high phase, the first clock CK is at the high level, and the second clock CKB is at the low level.

During the clock low phase, the header switch 112 and the footer switch 116 in the front stage 110 are turned on. The voltage at the node c is the second supply voltage $V_{DD2}$. The voltage at the node d is the ground voltage GND. That is, during the low phase of the clock, the front stage 110 is in the conversion mode, and the front stage 110 can be used as a level shifter. Under this circumstance, the input signal IN in the range between the first supply voltage $V_{DD1}$ and the ground voltage GND can be converted into the shifted signal $D_{LS}$ in the range between the second supply voltage $V_{DD2}$ and the ground voltage GND by the converter 114 of the front stage 110.

For example, when the input signal IN has the logic high level and the inverted input signal INB has the logic low level, the input signal IN is the first supply voltage $V_{DD1}$, and the inverted input signal INB is the ground voltage GND. Meanwhile, the transistor MN2 and the transistor MP3 are turned on, the transistor MN3 and the transistor MP2 are turned off, and the shifted signal $D_{LS}$ is the ground voltage GND. Whereas, when the input signal IN has the logic low level and the inverted input signal INB has the logic high level, the input signal IN is the ground voltage GND, and the inverted input signal INB is the first supply voltage $V_{DD1}$. Meanwhile, the transistor MN2 and the transistor MP3 are turned off, the transistor MN3 and the transistor MP2 are turned on, and the shifted signal $D_{LS}$ is the second supply voltage $V_{DD2}$.

During the clock low phase, the transmission gate 132 in the rear stage 130 is turned off, and the output terminal of the inverter 138 is not connected to the input terminal of the inverter 136. Meanwhile, the rear stage 130 is in the propagation mode, and the inverter 136 generates the output signal Q according to the shifted signal $D_{LS}$. For example, when the shifted signal $D_{LS}$ has the logic low level (i.e., the ground voltage GND), the output signal Q has the logic high level (i.e., the second supply voltage $V_{DD2}$). Whereas, when the shifted signal $D_{LS}$ has the logic high level (i.e., the second supply voltage $V_{DD2}$), the output signal Q has the logic low level (i.e., the ground voltage GND).

As mentioned above, during the clock low phase, the front stage 110 is in the conversion mode, and the rear stage 130 is in the propagation mode. Under this circumstance, the input signal IN received by the front stage 110 will be propagated to the output terminal of the rear stage 130 and served as the output signal Q. When the logic level of the input signal IN is subjected to a change during the clock low phase, the logic level of the output signal Q will be correspondingly changed.

For example, when the input signal IN has the logic high level (i.e., the first supply voltage $V_{DD1}$) during the clock low phase, the shifted signal $D_{LS}$ has the logic low level (i.e., the ground voltage GND), and the output signal Q has the logic high level (i.e., the second supply voltage $V_{DD2}$). Whereas, when the input signal IN has the logic low level (i.e., the ground voltage GND), the shifted signal $D_{LS}$ has the logic high level (i.e., the second supply voltage $V_{DD2}$), and the output signal Q has the logic low level (i.e., the ground voltage GND).

During the clock high phase, the header switch 112 and the footer switch 116 in the front stage 110 are turned off, and the nodes c and d are floating. Consequently, the converter 114 is not activated, and the front stage 110 is in a tri-state output mode. In addition, the output terminal of the front stage 110 has a high output impedance. In the tri-state mode, the output terminal of the front stage 110 can be regarded as disconnected from the input terminal of the rear stage 130, allowing the rear stage 130 to control the output signal Q by itself without interference from the front stage 110. In other words, during the clock high phase, the front stage 110 is not activated. Regardless of whether the input signal IN is subjected to the change, the output terminal of the front stage 110 has the high output impedance.

During the clock high phase, the transmission gate in the rear stage 130 is turned on, and the output terminal of the inverter 138 is connected to the input terminal of the inverter 136. Under this circumstance, the rear stage 130 is in the retention mode, and the rear stage 130 can be used as a latch.

For example, when the clock low phase is switched into the clock high phase, the output signal Q has the logic high level (i.e., the second supply voltage $V_{DD2}$). Meanwhile, the input terminal of the inverter 138 receives the logic high level (i.e., the second supply voltage $V_{DD2}$), and the output terminal of the inverter 138 generates the logic low level (i.e., the ground voltage GND). Furthermore, the input terminal of the inverter 136 receives the logic low level (i.e., the ground voltage GND), and the output terminal of the inverter 136 generates the logic high level (i.e., the second supply voltage $V_{DD2}$). In other words, the output signal Q will be maintained in the logic high level corresponding to the second supply voltage $V_{DD2}$.

Whereas, when the clock low phase is switched into the clock high phase, the output signal Q has a logic low level (i.e., the ground voltage GND). Meanwhile, the input terminal of the inverter 138 receives the logic low level (i.e., the ground voltage GND), and the output terminal of the inverter 138 generates a logic high level (i.e., the second supply voltage $V_{DD2}$). In addition, the input terminal of the inverter 136 receives the logic high level (i.e., the second supply voltage $V_{DD2}$), and the output terminal of the inverter 136 generates a logic low level (i.e., the ground voltage GND). In other words, the output signal Q will be maintained in the logic low level corresponding to the ground voltage GND.

As mentioned above, during the clock high phase, the front stage 110 is in the tri-state output mode, and the rear stage 130 is in the retention mode. Under this circumstance, the rear stage 130 is used as a latch. Furthermore, when the logic level of the input signal IN is subjected to the change, the logic level of the output signal Q will not be changed.

Figure 2:
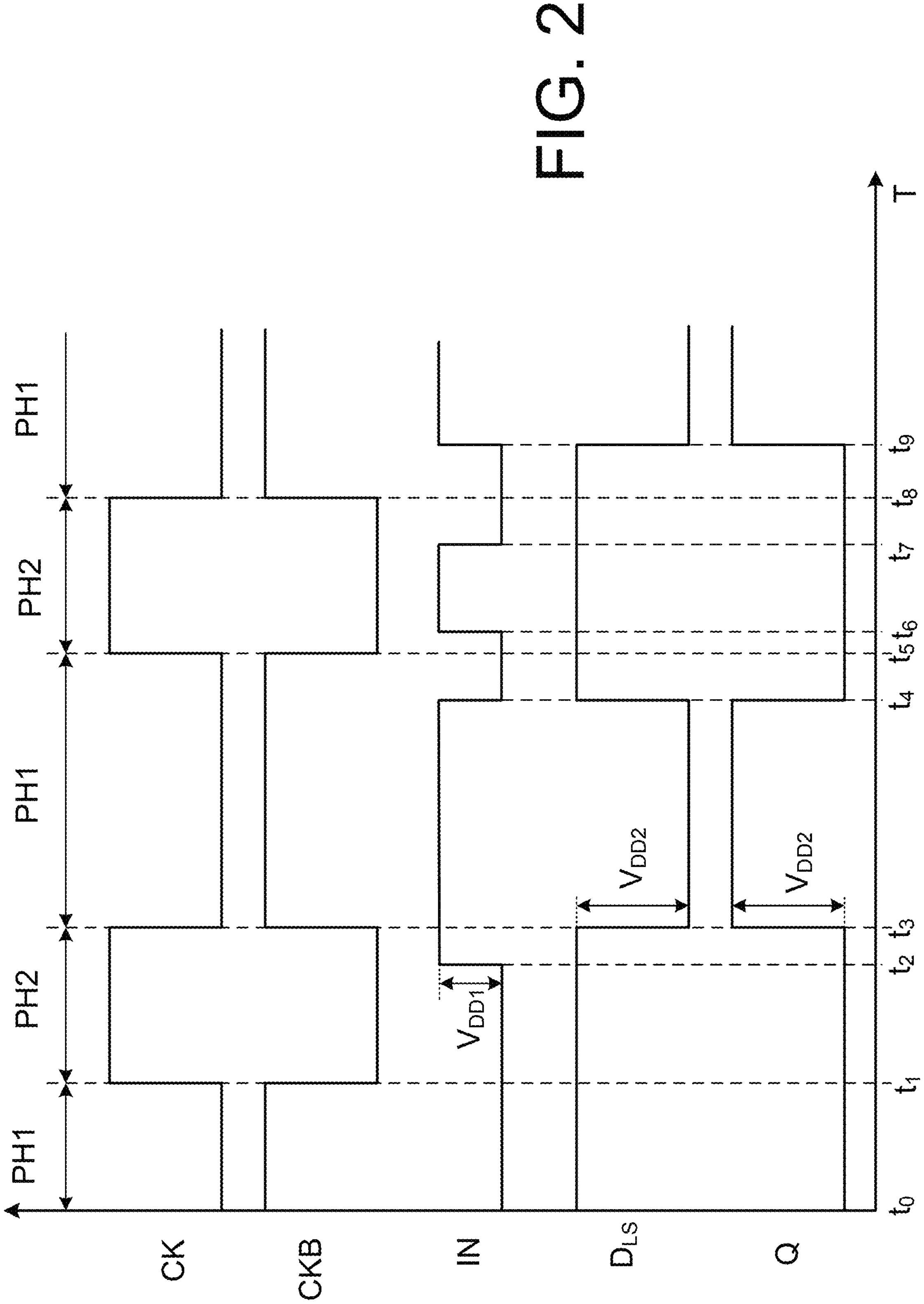
FIG. 2 is a schematic timing waveform diagram illustrating associated signals processed by the level shifting circuit according to the first embodiment of the present invention.

FIG. 2 is a schematic timing waveform diagram illustrating associated signals processed by the level shifting circuit according to the first embodiment of the present invention. The first phase PH1 is the clock low phase, and the second phase PH2 is the clock high phase.

The time interval between the time point $t_0$ and the time point $t_1$ is the first phase PH1. In the first phase PH1, the front stage 110 is in the conversion mode, and the rear stage 130 is in the propagation mode. In the time interval between the time point to and the time point $t_1$, the input signal IN received by the front stage 110 has the logic low level (i.e., the ground voltage GND), the shifted signal $D_{LS}$ generated by the front stage 110 has the logic high level (i.e., the second supply voltage $V_{DD2}$), and the output signal Q outputted from the rear stage 130 has the logic low level (i.e., the ground voltage GND).

The time interval between the time point $t_1$ and the time point $t_3$ is the second phase PH2. In the second phase PH2, the front stage 110 is in the tri-state output mode, and the rear stage 130 is in the retention mode. At the time point $t_1$, the output signal Q has the logic low level (i.e., the ground voltage GND). Consequently, in the second phase PH2, the logic level of the output signal Q is maintained at the logic low level (i.e., the ground voltage GND). At the time point $t_2$ of the second phase PH2, the logic level of the input signal IN is subjected to the change. However, the logic level of the output signal Q is maintained at the logic low level (i.e., the ground voltage GND) and kept unchanged.

The time interval between the time point $t_3$ and the time point $t_5$ is the first phase PH1. In the first phase PH1, the front stage 110 is in the conversion mode, and the rear stage 130 is in the propagation mode. In the time interval between the time point $t_3$ and the time point $t_4$, the input signal IN received by the front stage 110 has the logic high level (i.e., the first supply voltage $V_{DD1}$), the shifted signal $D_{LS}$ generated by the front stage 110 has the logic low level (i.e., the ground voltage GND), and the output signal Q outputted from the rear stage 130 has the logic high level (i.e., the second supply voltage $V_{DD2}$). In the time interval between the time point $t_4$ and the time point $t_5$, the input signal IN received by the front stage 110 has the logic low level (i.e., the ground voltage GND), the shifted signal $D_{LS}$ generated by the front stage 110 has the logic high level (i.e., the second supply voltage $V_{DD2}$), and the output signal Q outputted from the rear stage 130 has the logic low level (i.e., the ground voltage GND). In the first phase PH1, the input signal IN received by the front stage 110 is propagated to the output terminal of the rear stage 130 and served as the output signal Q. When the logic level of the input signal IN is subjected to the change, the logic level of the output signal Q will be correspondingly changed.

The time interval between the time point $t_5$ and the time point $t_8$ is the second phase PH2. In the second phase PH2, the front stage 110 is in the tri-state output mode, and the rear stage 130 is in the retention mode. At the time point $t_5$, the output signal Q has the logic low level (i.e., the ground voltage GND). Consequently, in the second phase PH2, the logic level of the output signal Q is maintained at the logic low level (i.e., the ground voltage GND). In the time interval between time point $t_6$ and the time point $t_7$ of the second phase PH2, the logic level of the input signal IN is subjected to the change. However, the logic level of the output signal Q is maintained at the logic low level (i.e., the ground voltage GND) and kept unchanged.

In the first phase PH1 after the time point $t_8$, the front stage 110 is in the conversion mode, and the rear stage 130 is in the propagation mode. In the time interval between the time point $t_8$ and the time point $t_9$, the input signal IN received by the front stage 110 has the logic low level (i.e., the ground voltage GND), the shifted signal $D_{LS}$ generated by the front stage 110 has the logic high level (i.e., the second supply voltage $V_{DD2}$), and the output signal Q outputted from the rear stage 130 has the logic low level (i.e., the ground voltage GND). After the time point $t_9$, the input signal IN received by the front stage 110 has the logic high level (i.e., the first supply voltage $V_{DD1}$), the shifted signal $D_{LS}$ generated by the front stage 110 has the logic low level (i.e., the ground voltage GND), and the output signal Q outputted from the rear stage 130 has the logic high level (i.e., the second supply voltage $V_{DD2}$).

In the above embodiment, each of the inverters 118, 136 and 138 is composed of two transistors. In other words, the level shifting circuit 100 is composed of 14 transistors. Consequently, the size of the level shifting circuit 100 can be effectively reduced. Furthermore, the front stage 110 is activated during the clock low phase only. In the clock high phase, the front stage 110 is not activated, and both of the header switch and the footer switch are turned off to avoid or reduce the leakage current. Since the front stage does not generate the leakage current, the power consumption of the level shifting circuit 100 will be largely reduced.

Figure 3:
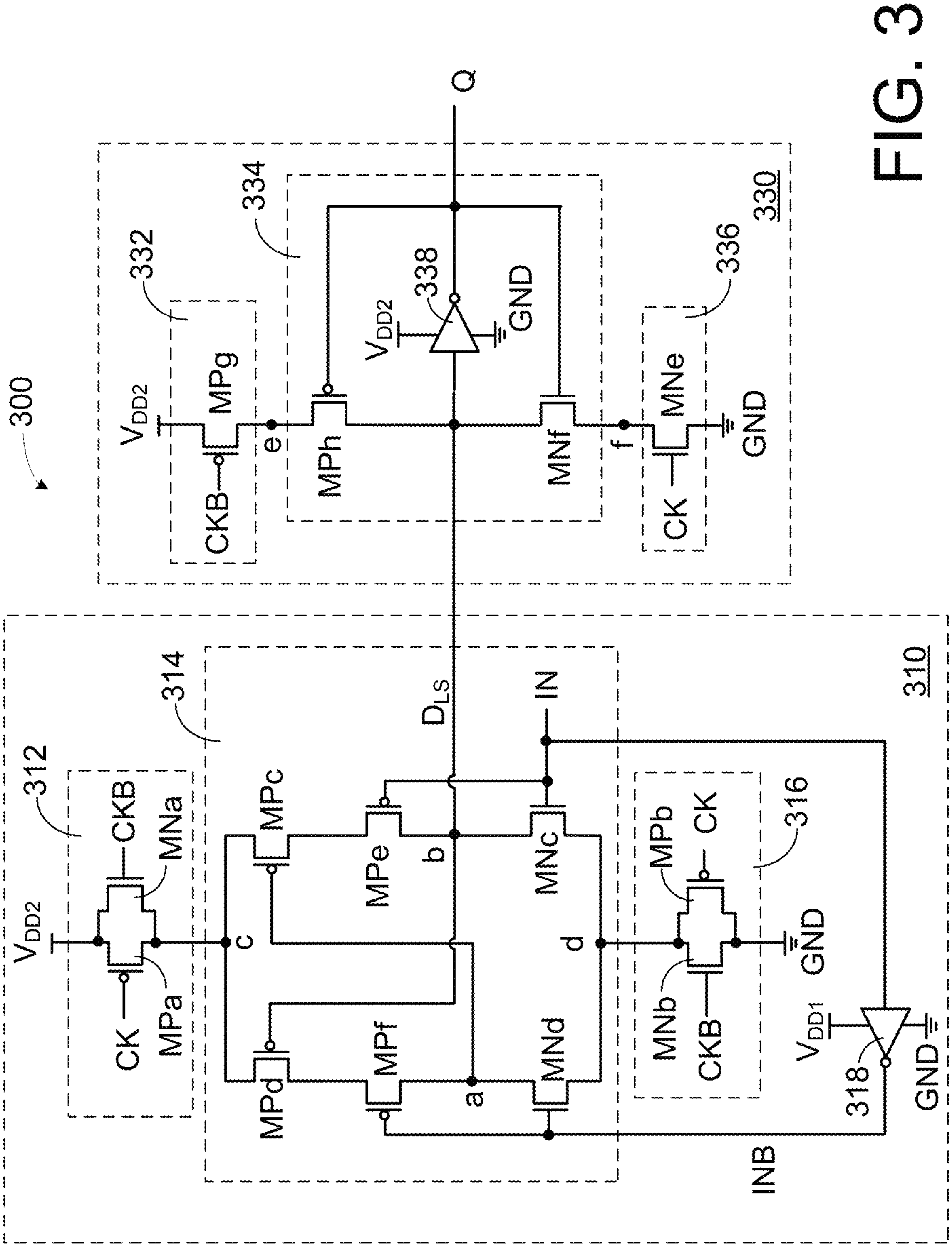
FIG. 3 is a schematic circuit diagram illustrating a level shifting circuit with an integrated latch according to a second embodiment of the present invention.

FIG. 3 is a schematic circuit diagram illustrating a level shifting circuit with an integrated latch according to a second embodiment of the present invention.

The level shifting circuit 300 includes a front stage 310 and a rear stage 330. The two clock terminals of the front stage 310 receive a first clock CK and a second clock CKB, respectively. The input terminal of the front stage 310 receives an input signal IN. The output terminal of the front stage 310 generates a shifted signal $D_{LS}$. The first clock CK and the second clock CKB are complementary to each other.

The two clock terminals of the rear stage 330 receive the first clock CK and the second clock CKB, respectively. The input terminal of the rear stage 330 is connected to the output terminal of the front stage 310 to receive the shifted signal $D_{LS}$. The output terminal of the rear stage 330 generates an output signal Q.

The first clock CK is at a first level during a first phase. The first clock CK is at a second level during a second phrase. Furthermore, during the operation of the level shifting circuit 300, the first phase and the second phase will continue to switch. In this embodiment, the first level of the first clock CK is a low level, and the first phase is a clock low phase. In addition, the second level of the first clock CK is a high level, and the second phase is a clock high phase.

The front stage 310 can be selectively operated in one of two operation modes. That is, the front stage 310 can be selectively operated in a tri-state output mode or a conversion mode. For example, during the clock high phase, the front stage 310 is in the tri-state output mode. That is, the output terminal of the front stage 310 has a high output impedance. During the clock low phase, the front stage 310 is in the conversion mode. In the conversion mode, a logic level conversion is performed on the input signal IN by the front stage 310, and the shifted signal $D_{LS}$ is outputted from the output terminal of the front stage 310.

Similarly, the rear stage 330 can be selectively operated in one of two operation modes. That is, the rear stage 330 can be selectively operated in a propagation mode or a retention mode. For example, during the clock low phase, the front stage 310 is in the conversion mode, and the rear stage 330 is in the propagation mode. Under this circumstance, the input signal IN received by the front stage 310 will be propagated to the output terminal of the rear stage 330 and served as the output signal Q. That is, the front stage 310 converts the input signal IN into the shifted signal $D_{LS}$, and the rear stage 330 receives the shifted signal $D_{LS}$ and generates the output signal Q. During the clock high phase, the front stage 310 is in the tri-state output mode, and the rear stage 330 is in the retention mode. That is, during the clock high phase, the output terminal of the front stage 310 has the high output impedance. And, the output signal Q from the rear stage 330 is maintained at a specific logic level and kept unchanged.

When the logic level of the input signal IN is subjected to a change in the clock low phase, the logic level of the output signal Q will be correspondingly changed. Whereas, when the logic level of the input signal IN is subjected to a change in the clock high phase, the logic level of the output signal Q is kept unchanged.

The detailed circuitry structure of the level shifting circuit 300 of the second embodiment will be described as follows. As shown in FIG. 3, the front stage 310 includes a header switch 312, a converter 314, a footer switch 316 and an inverter 318.

The two power terminals of the inverter 318 receive a first supply voltage $V_{DD1}$ and a ground voltage GND, respectively. The input terminal of the inverter 318 is connected to the input terminal of the front stage 310 to receive the input signal IN. The output terminal of the inverter 318 generates an inverted input signal INB.

The first terminal of the header switch 312 receives a second supply voltage $V_{DD2}$. The second terminal of the header switch 312 is connected to a node c. The two control terminals of the header switch 312 receive the first clock CK and the second clock CKB, respectively. For example, the header switch 312 is a transmission gate. The transmission gate includes a transistor MPa and a transistor MNa. The first terminal of the transistor MPa receives the second supply voltage $V_{DD2}$. The second terminal of the transistor MPa is connected to the node c. The control terminal of the transistor MPa receives the first clock CK. The first terminal of the transistor MNa receives the second supply voltage $V_{DD2}$. The second terminal of the transistor MNa is connected to the node c. The control terminal of the transistor MNa receives the second clock CKB.

The first terminal of the footer switch 316 is connected to a node d. The second terminal of the footer switch 316 receives the ground voltage GND. The two control terminals of the footer switch 316 receive the first clock CK and the second clock CKB, respectively. For example, the footer switch 316 is a transmission gate. The transmission gate includes a transistor MPb and a transistor MNb. The first terminal of the transistor MNb is connected to the node d. The second terminal of the transistor MNb receives the ground voltage GND. The control terminal of the transistor MNb receives the second clock CKB. The first terminal of the transistor MPb is connected to the node d. The second terminal of the transistor MPb receives the ground voltage GND. The control terminal of the transistor MPb receives the first clock CK.

The converter 314 has a first input terminal, a second input terminal, an output terminal, a first power terminal and a second power terminal. The first power terminal of the converter 314 is connected to the node c. The second power terminal of the converter 314 is connected to the node d. The first input terminal of the converter 314 is connected to the input terminal of the front stage 310 for receiving the input signal IN. The second input terminal of the converter 314 is connected to the output terminal of the inverter 318 for receiving the inverted input signal INB. The output terminal of the converter 314 generates the shifted signal $D_{LS}$.

The converter 314 includes transistors MPc, MPd, MPe, MPf, MNc and MNd. The first terminal of the transistor MPc is connected to the node c. The control terminal of the transistor MPc is connected to the node a. The first terminal of the transistor MPd is connected to the node c. The control terminal of the transistor MPd is connected to the node b. The first terminal of the transistor MPe is connected to the second terminal of the transistor MPc. The second terminal of the transistor MPe is connected to node b. The control terminal of the transistor MPe receives the input signal IN. The first terminal of the transistor MPf is connected to the second terminal of the transistor MPd. The second terminal of the transistor MPf is connected to the node a. The control terminal of the transistor MPf receives the inverted input signal INB. The first terminal of the transistor MNc is connected to the node b. The second terminal of the transistor MNc is connected to the node d. The control terminal of the transistor MNc receives the input signal IN. The first terminal of the transistor MNd is connected to the node a. The second terminal of the transistor MNd is connected to the node d. The control terminal of the transistor MNd receives the inverted input signal INB. The node b is the output terminal of converter 314 and also the output terminal of front stage 310. The voltage at the node b is the shifted signal $D_{LS}$.

The rear stage 330 includes a header switch 332, a storage circuit 334 and a footer switch 336. The first terminal of the header switch 332 receives the second supply voltage $V_{DD2}$. The second terminal of the header switch 332 is connected to the node e. The control terminal of the header switch 332 receives the second clock CKB. For example, the header switch 332 includes a transistor MPg. The first terminal of the transistor MPg receives the second supply voltage $V_{DD2}$. The second terminal of the transistor MPg is connected to the node e. The control terminal of the transistor MPg receives the second clock CKB.

The first terminal of the footer switch 336 is connected to the node f. The second terminal of the footer switch 316 receives the ground voltage GND. The control terminal of the footer switch 336 receives the first clock CK. For example, the footer switch 336 includes a transistor MNe. The first terminal of transistor MNe is connected to the node f. The second terminal of transistor MNe receives the ground voltage GND. The control terminal of transistor MNe receives the first clock CK.

The storage circuit 334 has an input terminal and an output terminal. The input terminal of the storage circuit 334 is connected to the output terminal of the front stage 310 to receive the shifted signal $D_{LS}$. The output terminal of the storage circuit 334 generates an output signal Q.

The storage circuit 334 includes a transistor MPh, a transistor MNf and an inverter 338. The two power terminals of the inverter 338 receive the second supply voltage $V_{DD2}$ and the ground voltage GND, respectively. The input terminal of the inverter 338 is connected to the output terminal of the front stage 310 to receive the shifted signal $D_{LS}$. The output terminal of the inverter 318 generates an output signal Q. The first terminal of the transistor MPh is connected to the node e. The second terminal of the transistor MPh is connected to the input terminal of the inverter 338.

The control terminal of the transistor MPh is connected to the output terminal of the inverter 338. The first terminal of the transistor MNf is connected to the input terminal of the inverter 338. The second terminal of the transistor MNf is connected to the node f. The control terminal of the transistor MNf is connected to the output terminal of the inverter 338.

The operations of the level shifting circuit 300 of the second embodiment will be described in more detail as follows. The first phase is the clock low phase. In the clock low phase, the first clock CK is at the low level, and the second clock CKB is at the high level. The second phase is the clock high phase. In the clock high phase, the first clock CK is at the high level, and the second clock CKB is at the low level.

During the clock low phase, the header switch 312 and the footer switch 316 in the front stage 310 are turned on. The voltage at the node c is the second supply voltage $V_{DD2}$. The voltage at the node d is the ground voltage GND. That is, during the low phase of the clock, the front stage 310 is in the conversion mode, and the front stage 310 can be used as a level shifter. Under this circumstance, the input signal IN in the range between the first supply voltage $V_{DD1}$ and the ground voltage GND can be converted into the shifted signal $D_{LS}$ in the range between the second supply voltage $V_{DD2}$ and the ground voltage GND by the converter 314 of the front stage 310.

For example, when the input signal IN has the logic high level and the inverted input signal INB has the logic low level, the input signal IN is the first supply voltage $V_{DD1}$, and the inverted input signal INB is the ground voltage GND. Meanwhile, the transistor MNc, the transistor MPd and the transistor MPf are turned on, the transistor MNd, the transistor MPc and the transistor MPe are turned off, and the shifted signal $D_{LS}$ is the ground voltage GND. Whereas, when the input signal IN has the logic low level and the inverted input signal INB has the logic high level, the input signal IN is the ground voltage GND, and the inverted input signal INB is the first supply voltage $V_{DD1}$. Meanwhile, the transistor MNc, the transistor MPd and the transistor MPf are turned off, the transistor MNd, the transistor MPc and the transistor MPe are turned on, and the shifted signal $D_{LS}$ is the second supply voltage $V_{DD2}$.

During the clock low phase, the header switch 332 and the footer switch 336 in the rear stage 330 are turned off. The voltages at the nodes e and f are in a floating state. The transistor MPh and the transistor MNf are turned off. Meanwhile, the rear stage 330 is in the propagation mode, and the inverter 338 generates the output signal Q according to the shifted signal $D_{LS}$. For example, when the shifted signal $D_{LS}$ has the logic low level (i.e., the ground voltage GND), the output signal Q has the logic high level (i.e., the second supply voltage $V_{DD2}$). Whereas, when the shifted signal $D_{LS}$ has the logic high level (i.e., the second supply voltage $V_{DD2}$), the output signal Q has the logic low level (i.e., the ground voltage GND).

As mentioned above, during the clock low phase, the front stage 310 is in the conversion mode, and the rear stage 330 is in the propagation mode. Under this circumstance, the input signal IN received by the front stage 310 will be propagated to the output terminal of the rear stage 330 and served as the output signal Q. When the logic level of the input signal IN is subjected to a change in the clock low phase, the logic level of the output signal Q will be correspondingly changed.

For example, when the input signal IN has the logic high level (i.e., the first supply voltage $V_{DD1}$) in the clock low phase, the shifted signal $D_{LS}$ has the logic low level (i.e., the ground voltage GND), and the output signal Q has the logic high level (i.e., the second supply voltage $V_{DD2}$). Whereas, when the input signal IN has the logic low level (i.e., the ground voltage GND), the shifted signal $D_{LS}$ has the logic high level (i.e., the second supply voltage $V_{DD2}$), and the output signal Q has the logic low level (i.e., the ground voltage GND).

During the clock high phase, the header switch 312 and the footer switch 316 in the front stage 310 are turned off, and the voltages at the nodes c and d are in the floating state. Consequently, the converter 314 is not activated, and the front stage 310 is in a tri-state output mode. In addition, the output terminal of the front stage 310 has a high output impedance. In other words, during the clock high phase, the front stage 310 is not activated. Regardless of whether the input signal IN is subjected to the change, the output terminal of the front stage 310 has the high output impedance.

During the clock high phase, the header switch 332 and the footer switch 336 in the rear stage 330 are turned on. The voltage at the node e is the second supply voltage $V_{DD2}$. The voltage at the node d is the ground voltage GND. Under this circumstance, the rear stage 330 is in the retention mode, and the rear stage 330 can be used as a latch.

For example, when the clock low phase is switched into the clock high phase, the output signal Q has the logic high level (i.e., the second supply voltage $V_{DD2}$). Meanwhile, the transistor MNf is turned on, and the transistor MPh is turned off. The input terminal of the inverter 338 receives the logic low level (i.e., the ground voltage GND), and the output terminal of the inverter 338 generates the logic high level (i.e., the second supply voltage $V_{DD2}$). In other words, the output signal Q will be maintained in the logic high level corresponding to the second supply voltage $V_{DD2}$.

Whereas, when the clock low phase is switched into the clock high phase, the output signal Q has a logic low level (i.e., the ground voltage GND). Meanwhile, the transistor MNf is turned off, and the transistor MPh is turned on. The input terminal of the inverter 338 receives the logic high level (i.e., the second supply voltage $V_{DD2}$), and the output terminal of the inverter 338 generates a logic low level (i.e., the ground voltage GND). In other words, the output signal Q will be maintained in the logic low level corresponding to the ground voltage GND.

As mentioned above, during the clock high phase, the front stage 310 is in the tri-state output mode, and the rear stage 330 is in the retention mode. Under this circumstance, the rear stage 330 is used as a latch. Furthermore, when the logic level of the input signal IN is subjected to the change, the logic level of the output signal Q will not be changed.

Similarly, when the input signal IN, the first clock CK and the second clock CKB are provided to the level shifting circuit 300, the waveforms of the shifted signal $D_{LS}$ and the output signal Q generated by the level shifting circuit 300 are similar to those of FIG. 2.

Figure 4:
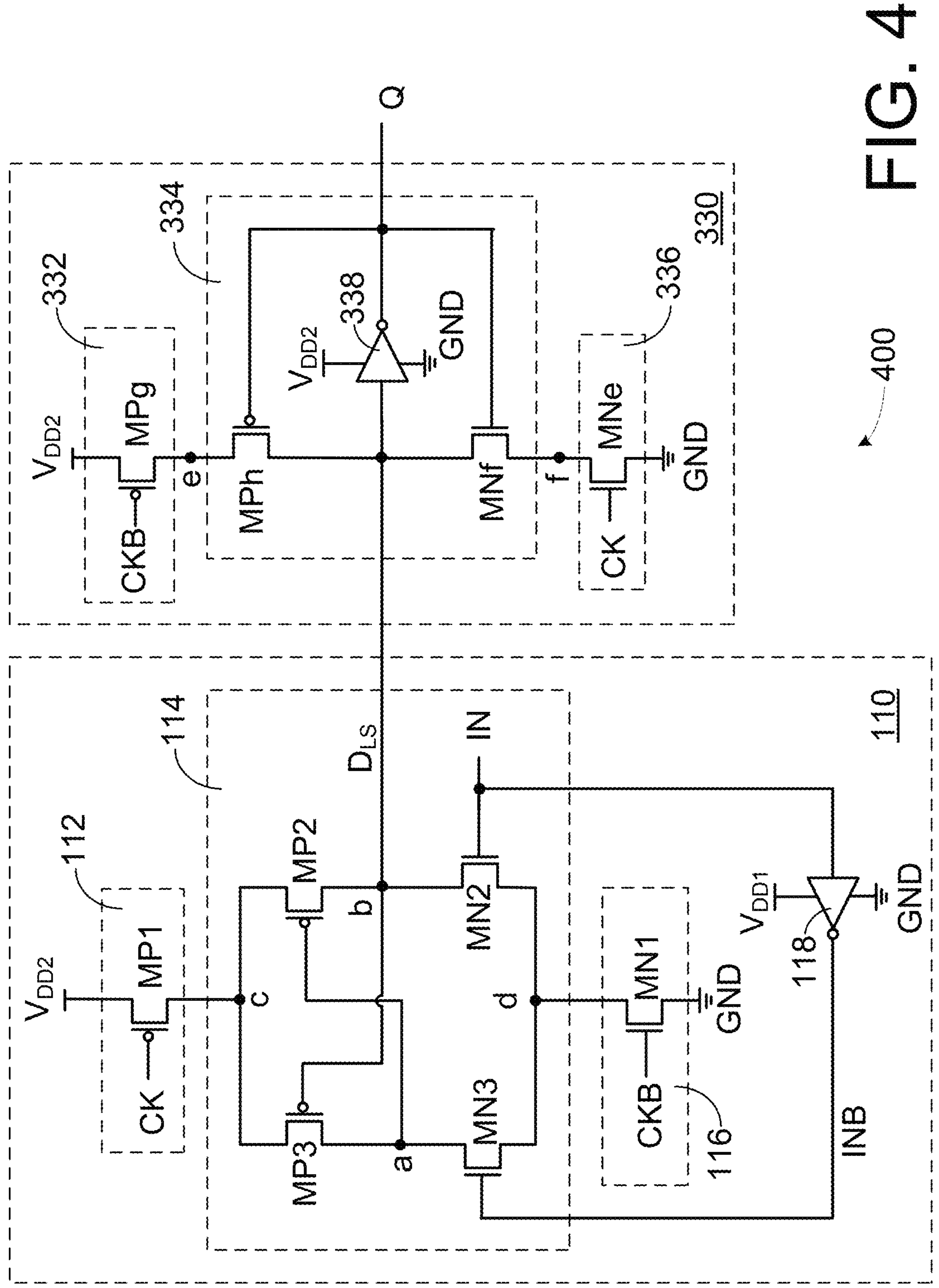
FIG. 4 is a schematic circuit diagram illustrating a level shifting circuit with an integrated latch according to a third embodiment of the present invention.
Figure 5:
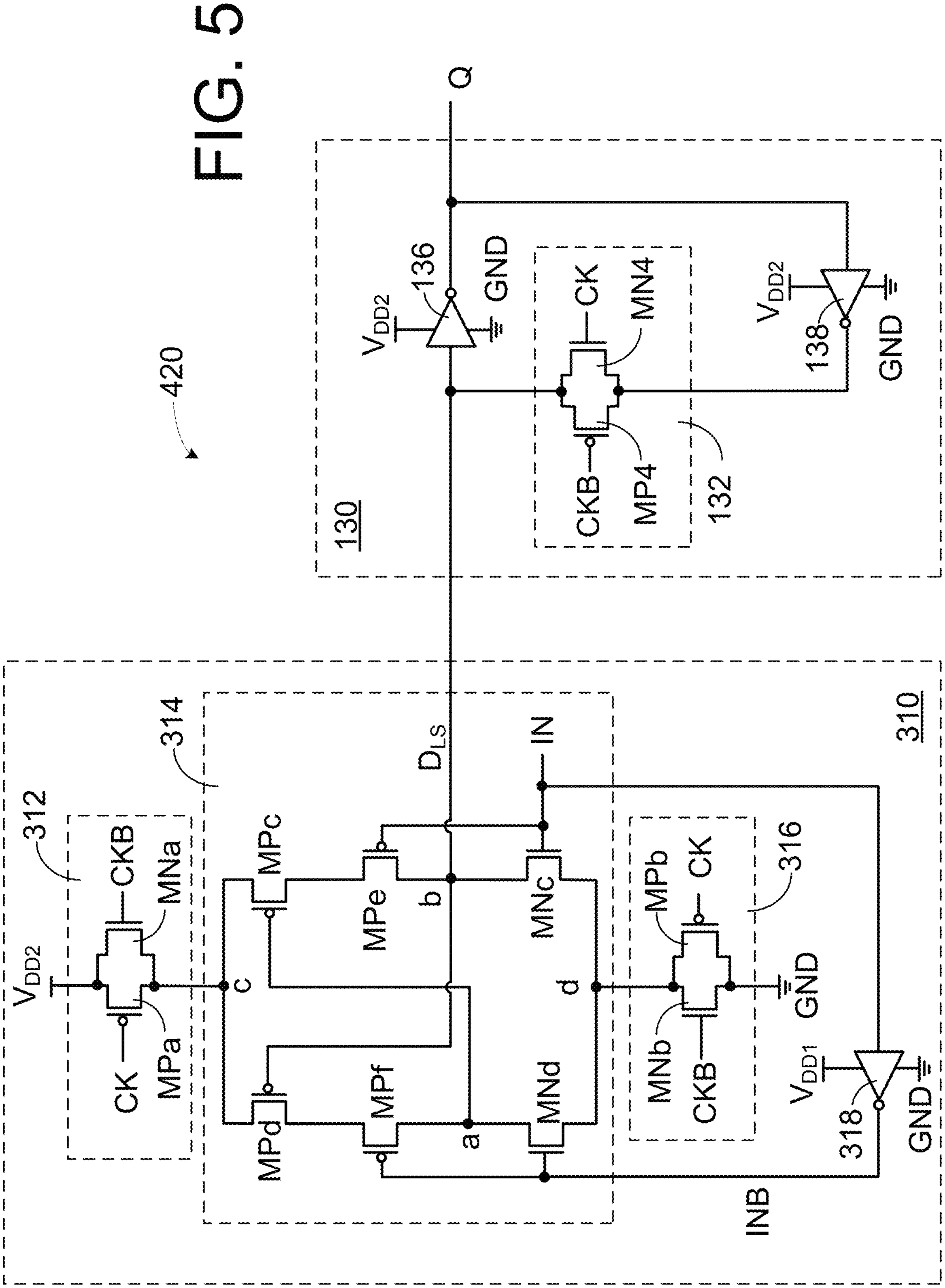
FIG. 5 is a schematic circuit diagram illustrating a level shifting circuit with an integrated latch according to a fourth embodiment of the present invention.

It is noted that numerous modifications and alterations may be made while retaining the teachings of the invention. For example, in a variant example, a portion of the level shifting circuit 100 and another portion of the level shifting circuit 300 are combined as another level shifting circuit. As shown in FIG. 4, it is a schematic circuit diagram illustrating a level shifting circuit with an integrated latch according to a third embodiment of the present invention. A level shifting circuit 400 of the third embodiment includes the front stage 110 of the level shifting circuit 100 and the rear stage 330 of the level shifting circuit 300. As shown in FIG. 5, it is a schematic circuit diagram illustrating a level shifting circuit with an integrated latch according to a fourth embodiment of the present invention. A level shifting circuit 420 of the fourth embodiment includes the front stage 310 of the level shifting circuit 300 and the rear stage 130 of the level shifting circuit 100.

Figure 6:
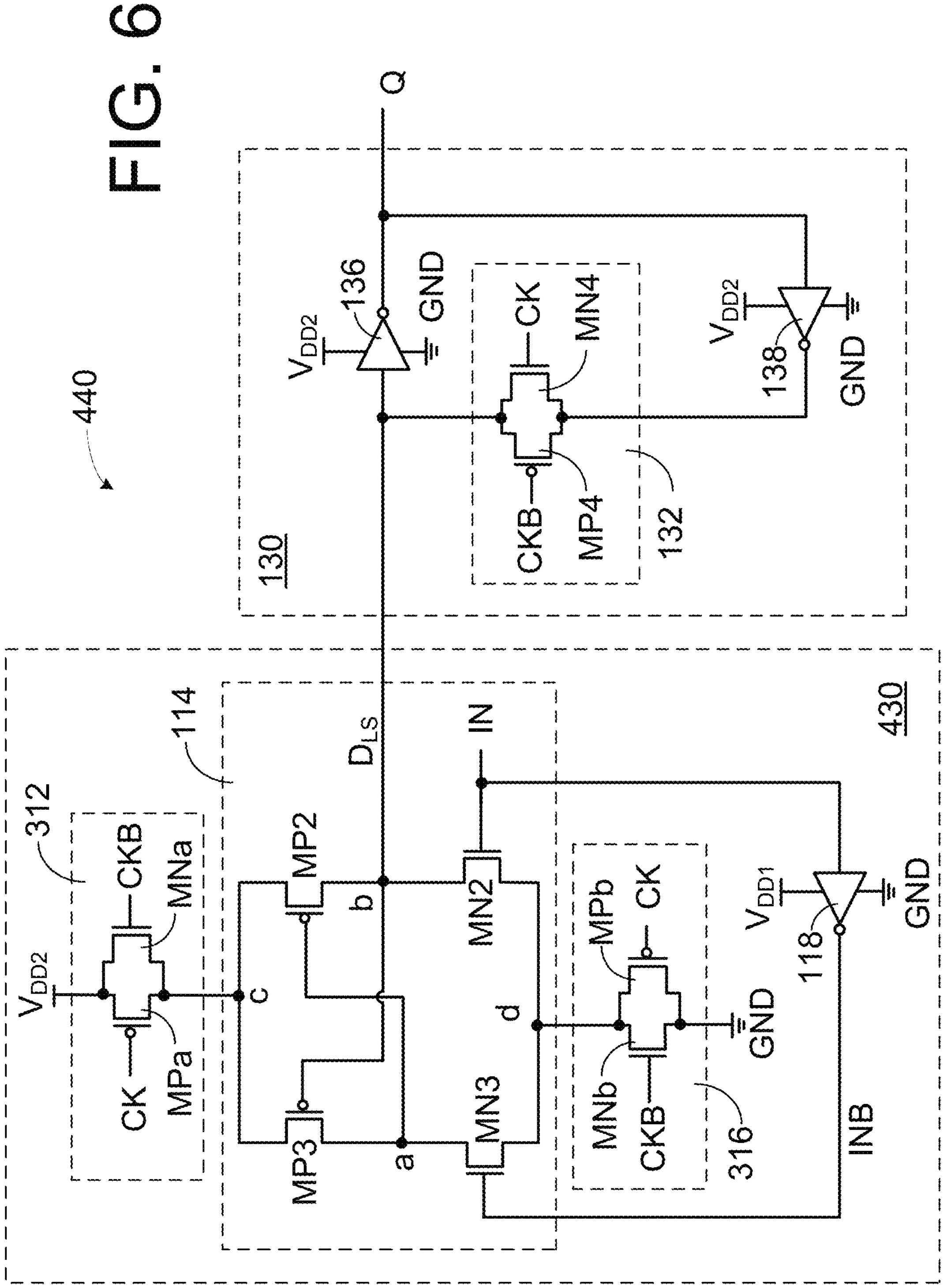
FIG. 6 is a schematic circuit diagram illustrating a level shifting circuit with an integrated latch according to a fifth embodiment of the present invention.

In a variant example, the header switch 112 and the footer switch 116 in the front stage 110 of the first embodiment can be replaced by the header switch 312 and the footer switch 316 in the front stage 310 of the second embodiment. As shown in FIG. 6, it is a schematic circuit diagram illustrating a level shifting circuit with an integrated latch according to a fifth embodiment of the present invention. The level shifting circuit 440 of the fifth embodiment includes the front stage 430 and the rear stage 130. Furthermore, the front stage 430 includes the header switch 312 and the footer switch 316 shown in FIG. 3, and further includes the converter 114 and the inverter 118 shown in FIG. 1.

Figure 7:
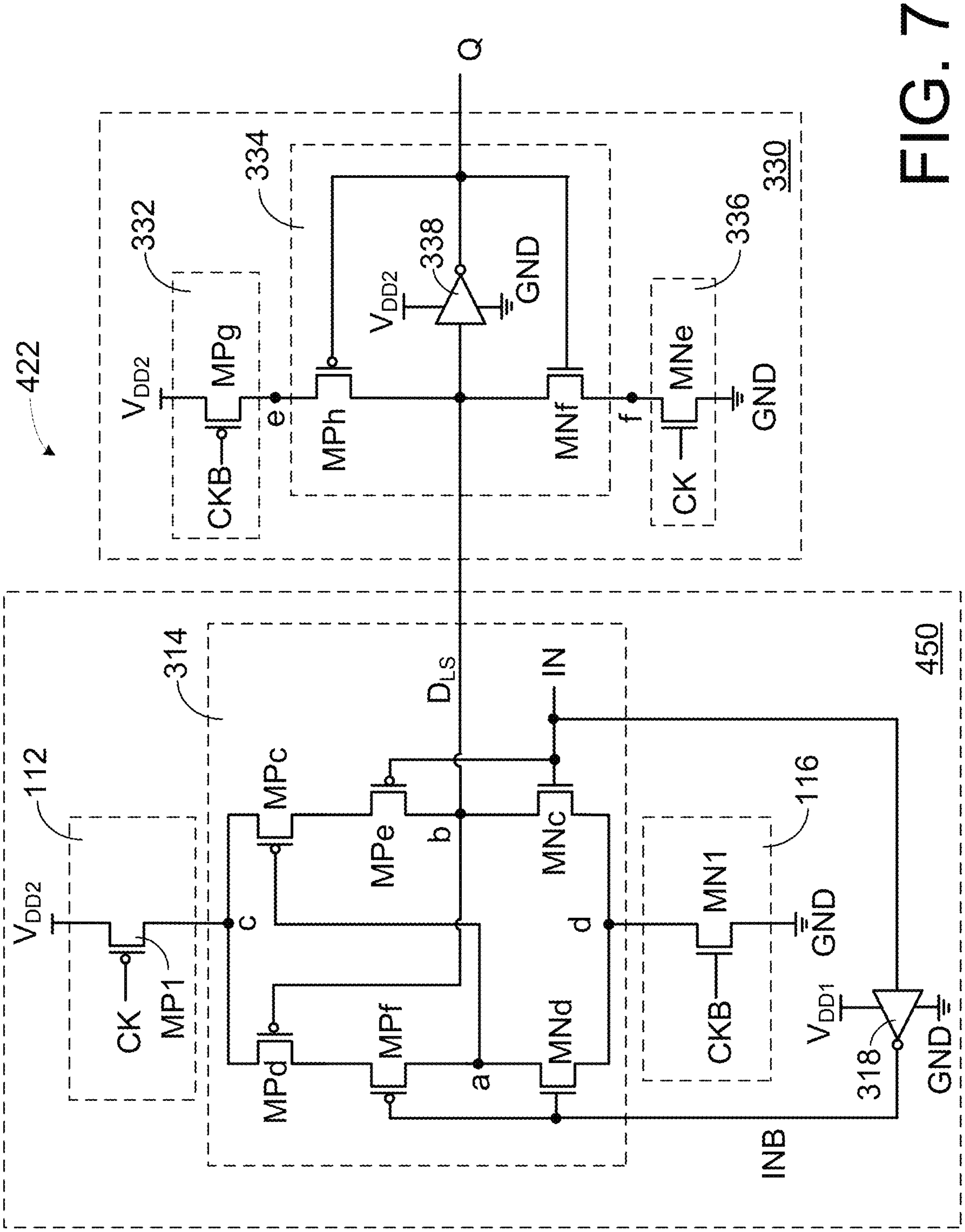
FIG. 7 is a schematic circuit diagram illustrating a level shifting circuit with an integrated latch according to a sixth embodiment of the present invention.

Similarly, the header switch 312 and the footer switch 316 in the front stage 310 of the second embodiment can be replaced by the header switch 112 and the footer switch 116 in the front stage 110 of the first embodiment. As shown in FIG. 7, it is a schematic circuit diagram illustrating a level shifting circuit with an integrated latch according to a sixth embodiment of the present invention. A level shifting circuit 422 of the sixth embodiment includes the front stage 450 and the rear stage 330 of the level shifting circuit 300. The front stage 450 includes the header switch 112 and the footer switch 116 shown in FIG. 1, and the converter 314 and the inverter 318 shown in FIG. 3.

Figure 8:
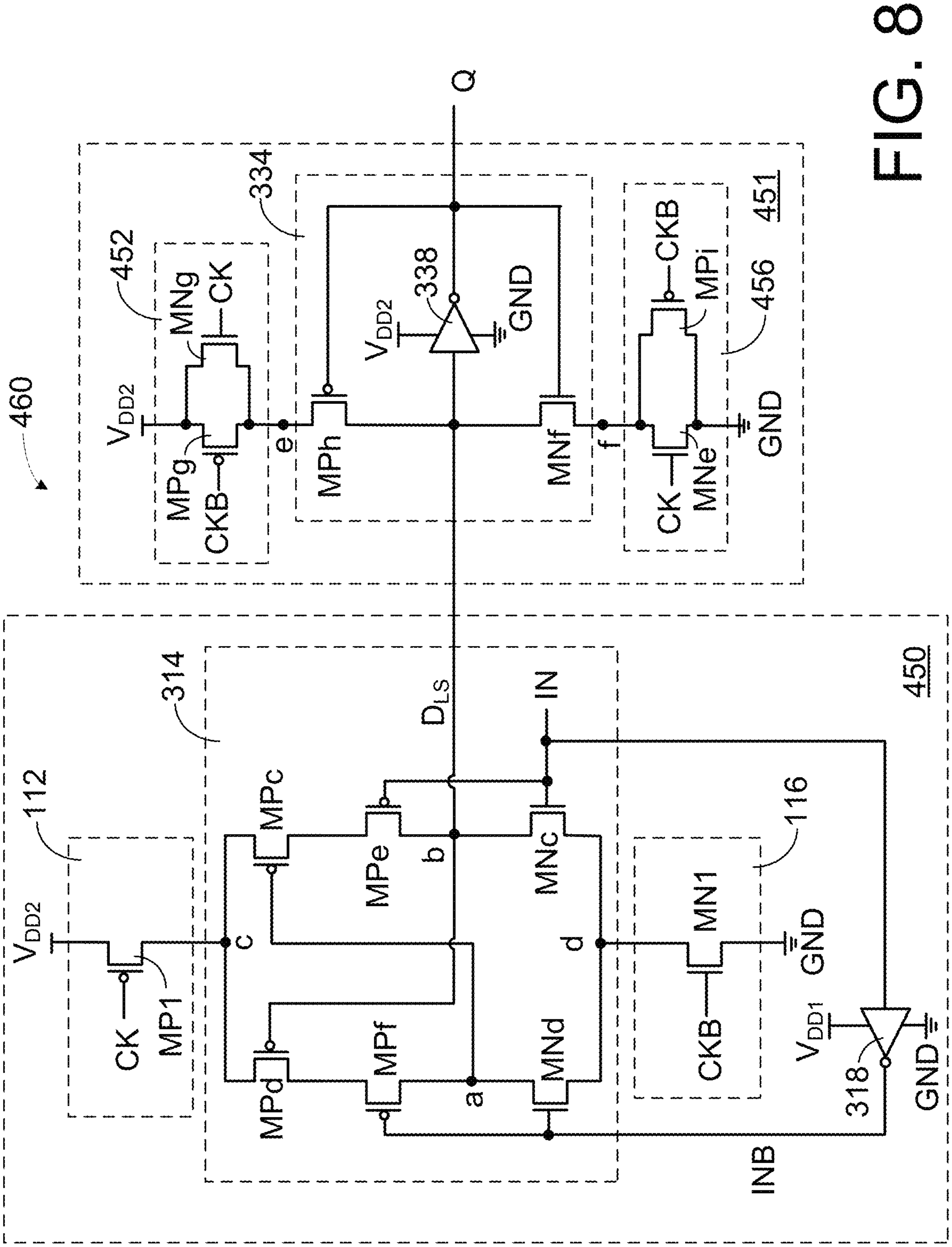
FIG. 8 is a schematic circuit diagram illustrating a level shifting circuit with an integrated latch according to a seventh embodiment of the present invention.

Also, the header switch 332 and the footer switch 336 in the rear stage 330 can be replaced by the transmission gates. As shown in FIG. 8, it is a schematic circuit diagram illustrating a level shifting circuit with an integrated latch according to a seventh embodiment of the present invention. The level shifting circuit 460 of the seventh embodiment includes the front stage 450 shown in FIG. 7, and the rear stage 451. The rear stage 451 includes the storage circuit 334 shown in FIG. 3, a header switch 452 and a footer switch 456. The header switch 452 includes a transistor MPg and a transistor MNg. The first terminal of the transistor MPg receives the second supply voltage $V_{DD2}$. The second terminal of the transistor MPg is connected to the node e. The control terminal of the transistor MPg receives the second clock CKB. The first terminal of the transistor MNg receives the second supply voltage $V_{DD2}$. The second terminal of the transistor MNg is connected to the node e. The control terminal of the transistor MNg receives the first clock CK. The footer switch 456 includes a transistor MPi and a transistor MNe. The first terminal of the transistor MNe is connected to the node f. The second terminal of the transistor MNe receives the ground voltage GND. The control terminal of the transistor MNe receives the first clock CK. The first terminal of the transistor MPi is connected to the node f. The second terminal of the transistor MPi receives the ground voltage GND. The control terminal of the transistor MPi receives the second clock CKB. In another variant example, the inverted input signal INB described above can be provided by other types of circuits capable of providing an inverted signal of the input signal IN. Of course, any other appropriate converter can be applied to the level shifting circuit of the present invention.

Figure 9:
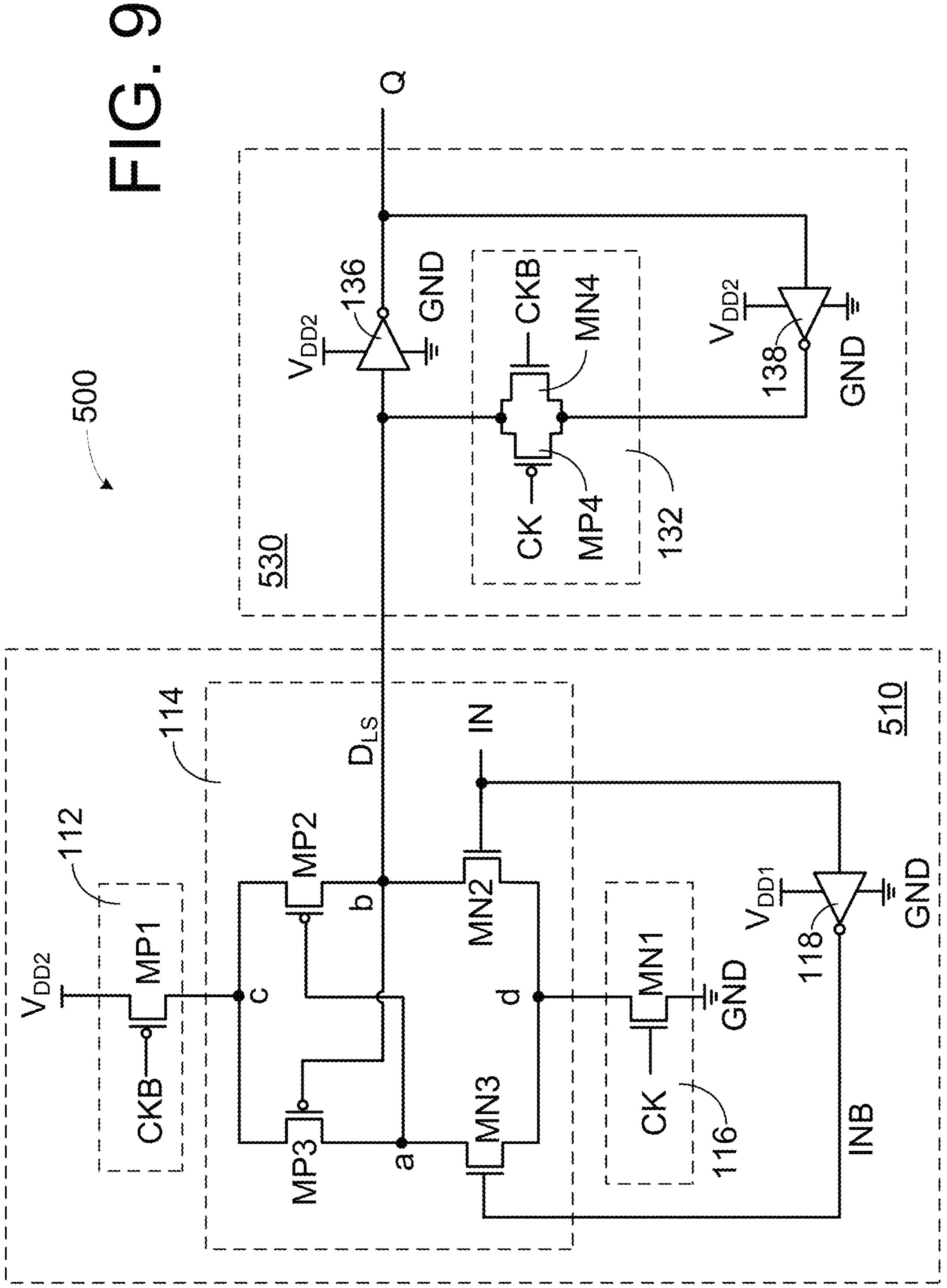
FIG. 9 is a schematic circuit diagram illustrating a level shifting circuit with an integrated latch according to an eighth embodiment of the present invention.

FIG. 9 is a schematic circuit diagram illustrating a level shifting circuit with an integrated latch according to an eighth embodiment of the present invention. In comparison with the level shifting circuit 100 of the first embodiment, the terminals for receiving the first clock CK and the second clock CKB are changed. For brevity, only the distinguished aspects of the level shifting circuit 500 of the eighth embodiment will be described as follows.

In the front stage 510, the control terminal of the header switch 112 receives the second clock CKB, and the control terminal of the footer switch 116 receives the first clock CK. In the transmission gate 132 of the rear stage 530, the control terminal of the transistor MP4 receives the first clock CK, and the control terminal of the transistor MN4 receives the second clock CKB.

As mentioned above, in the level shifting circuit 500 of the eighth embodiment, the terminals for receiving the first clock CK and the second clock CKB are changed. The first phase is a clock high phase. The second phase is a clock low phase. During the first phase (i.e., the clock high phase), the front stage 510 is in the conversion mode, and the rear stage 130 is in the propagation mode. In addition, the front stage 510 can be used as a level shifter. During the second phase (i.e., the clock low phase), the front stage 510 is in the tri-state output mode, and the rear stage 530 is in the retention mode. In addition, the rear stage 530 is served as a latch.

Figure 10:
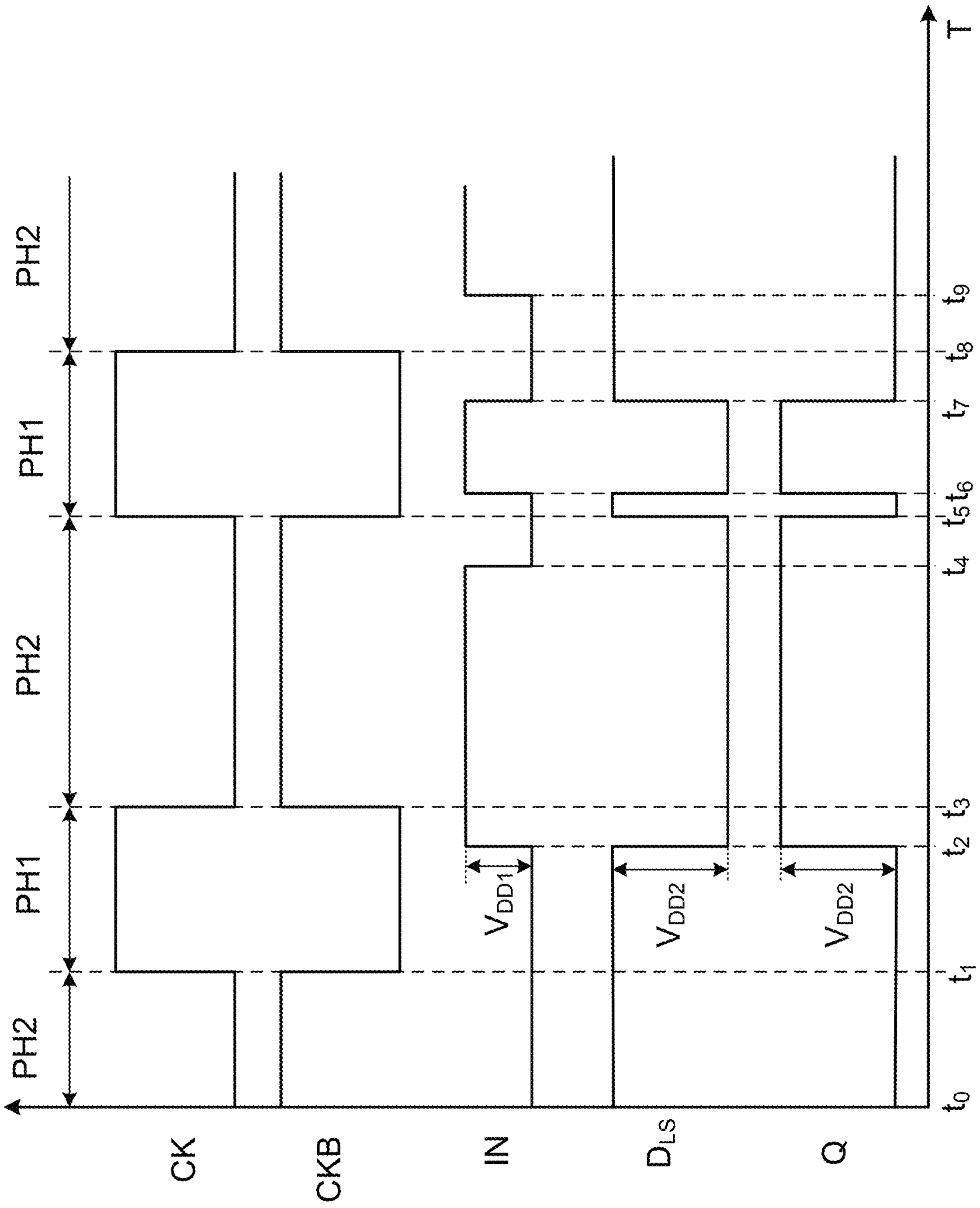
FIG. 10 is a schematic timing waveform diagram illustrating associated signals processed by the level shifting circuit according to the eighth embodiment of the present invention.

When the input signal IN, the first clock CK and the second clock CKB are provided to the level shifting circuit 500, the waveforms of the associated processed by the level shifting circuit 500 will be illustrated with reference to FIG. 10. FIG. 10 is a schematic timing waveform diagram illustrating associated signals processed by the level shifting circuit according to the eighth embodiment of the present invention. The first phase PH1 is the clock high phase, and the second phase PH2 is the clock low phase.

The time interval between the time point $t_1$ and the time point $t_3$ is the first phase PH1. In the first phase PH1, the front stage 510 is in the conversion mode, and the rear stage 530 is in the propagation mode. In the time interval between the time point $t_1$ and the time point $t_2$, the input signal IN received by the front stage 510 has the logic low level (i.e., the ground voltage GND), the shifted signal $D_{LS}$ generated by the front stage 510 has the logic high level (i.e., the second supply voltage $V_{DD2}$), and the output signal Q outputted from the rear stage 530 has the logic low level (i.e., the ground voltage GND). In the time interval between the time point $t_2$ and the time point $t_3$, the input signal IN received by the front stage 510 has the logic high level (i.e., the first supply voltage $V_{DD1}$), the shifted signal $D_{LS}$ generated by the front stage 510 has the logic low level (i.e., the ground voltage GND), and the output signal Q outputted from the rear stage 530 has the logic high level (i.e., the second supply voltage $V_{DD2}$). That is, in the first phase PH1, the input signal IN received by the front stage 510 is propagated to the output terminal of the rear stage 530 and served as the output signal Q. Furthermore, when the logic level of the input signal IN is subjected to the change, the logic level of the output signal Q will be correspondingly changed.

The time interval between the time point $t_3$ and the time point $t_5$ is the second phase PH2. In the second phase PH2, the front stage 510 is in the tri-state output mode, and the rear stage 530 is in the retention mode. At the time point $t_3$, the output signal Q has the logic high level (i.e., the second supply voltage $V_{DD2}$). Consequently, in the second phase PH2, the logic level of the output signal Q is maintained at the logic high level (i.e., the second supply voltage $V_{DD2}$). Furthermore, at the time point $t_4$ of the second phase PH2, the logic level of the input signal IN is subjected to the change. However, the logic level of the output signal Q is maintained at the logic high level (i.e., the second supply voltage $V_{DD2}$) and kept unchanged.

The time interval between the time point $t_5$ and the time point $t_8$ is the first phase PH1. In the first phase PH1, the front stage 510 is in the conversion mode, and the rear stage 530 is in the propagation mode. When the logic level of the input signal IN is subjected to the change in the first phase PH1, the logic level of the output signal Q will be correspondingly changed.

In the second phase PH2 after the time point $t_8$, the front stage 510 is in the tri-state output mode, and the rear stage 530 is in the retention mode. At the time point $t_8$, the output signal Q has the logic low level (i.e., the ground voltage GND). Consequently, in the second phase PH2, the logic level of the output signal Q is maintained at the logic low level (i.e., the ground voltage GND) and kept unchanged.

Similarly, in some variant examples of the second, third, fourth, fifth, sixth and seventh embodiments, the terminals for receiving the first clock CK and the second clock CKB are changed.

From the above descriptions, the present invention provides a level shifting circuit with an integrated latch. The level shifting circuit can be applied to a dual rail SRAM. The number of transistors used in the level shifting circuit is reduced. Since the magnitude of the leakage current generated by the level shifting circuit is very low, the level shifting circuit can be applicable to the ultra-low leakage (ULL) SRAM or other types of low leakage devices. For the smaller-sized instances, the area reduction in the ULL SRAM may be approximately 15%. For the bigger-sized instances, the area reduction in the ULL SRAM may be in the range of 5% to 7%. Note that these values are provided as examples and are not intended to be limiting.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifting circuit with an integrated latch, the level shifting circuit comprising:

a front stage, wherein an input terminal of the front stage is arranged to receive an input signal, a first clock terminal of the front stage is arranged to receive a first clock, a second clock terminal of the front stage is arranged to receive a second clock, wherein the first clock and the second clock are complementary to each other, the first clock is at a first level during a first phase, and the first clock is at a second level during a second phase;

a rear stage, wherein an input terminal of the rear stage is connected to an output terminal of the front stage, a first clock terminal of the rear stage is arranged to receive the first clock, a second clock terminal of the rear stage is arranged to receive the second clock, and an output terminal of the rear stage is arranged to generate an output signal, wherein during the first phase, the front stage is in a conversion mode, the rear stage is in a propagation mode, and the front stage serves as a level shifter, wherein the input signal in a range between a first supply voltage and a ground voltage is converted into a shifted signal in a range between a second supply voltage and the ground voltage by the front stage, and the rear stage is configured to receive the shifted signal and generate the output signal, wherein the first supply voltage is lower than the second supply voltage, wherein during the second phase, the front stage is in a tri-state output mode, the rear stage is in a retention mode, and the rear stage serves as a latch, wherein the output terminal of the front stage has a high output impedance, and the output signal from the rear stage is maintained at a specified logic level and kept unchanged.

2. The level shifting circuit as claimed in claim 1, wherein when a logic level of the input signal is subjected to a change during the first phase, the logic level of the output signal is correspondingly changed, wherein when the logic level of the input signal is subjected to the change during the second phase, the output signal is maintained at the specified logic level and kept unchanged.

3. The level shifting circuit as claimed in claim 1, wherein the front stage comprises:

a header switch, wherein a first terminal of the header switch is arranged to receive the second supply voltage, a second terminal of the header switch is connected to a first node, and a control terminal of the header switch is arranged to receive the first clock;

a footer switch, wherein a first terminal of the footer switch is connected to a second node, a second terminal of the footer switch is arranged to receive the ground voltage, and a control terminal of the footer switch is arranged to receive the second clock; and a converter, wherein a first power terminal of the converter is connected to the first node, a second power terminal of the converter is connected to the second node, a first input terminal of the converter is arranged to receive the input signal, and a second input terminal of the converter is arranged to receive an inverted signal of the input signal, wherein during the first phase, the shifted signal is outputted from an output terminal of the converter, and the input signal in the range between the first supply voltage and the ground voltage is converted into the shifted signal in the range between the second supply voltage and the ground voltage by the converter, wherein during the second phase, the output terminal of the converter has the high output impedance.

4. The level shifting circuit as claimed in claim 3, wherein the header switch comprises a first transistor, wherein a first terminal of the first transistor is arranged to receive the second supply voltage, a second terminal of the first transistor is connected to the first node, and a control terminal of the first transistor is arranged to receive the first clock.

5. The level shifting circuit as claimed in claim 4, wherein the footer switch comprises a second transistor, wherein a first terminal of the second transistor is connected to the second node, a second terminal of the second transistor is arranged to receive the ground voltage, and a control terminal of the second transistor is arranged to receive the second clock.

6. The level shifting circuit as claimed in claim 3, wherein the converter comprises:

a first transistor, wherein a first terminal of the first transistor is connected to a third node, a second terminal of the first transistor is connected to the second node, and a control terminal of the first transistor is arranged to receive the input signal;

a second transistor, wherein a first terminal of the second transistor is connected to a fourth node, a second terminal of the second transistor is connected to the second node, and a control terminal of the second transistor is arranged to receive the inverted signal;

a third transistor, wherein a first terminal of the third transistor is connected to the first node, a second terminal of the third transistor is connected to the third node, and a control terminal of the third transistor is connected to the fourth node; and a fourth transistor, wherein a first terminal of the fourth transistor is connected to the first node, a second terminal of the fourth transistor is connected to the fourth node, and a control terminal of the fourth transistor is connected to the third node, wherein the third node is the output terminal of the front stage.

7. The level shifting circuit as claimed in claim 3, wherein the header switch comprises:

a first transistor, wherein a first terminal of the first transistor is arranged to receive the second supply voltage, a second terminal of the first transistor is connected to the first node, and a control terminal of the first transistor is arranged to receive the first clock; and a second transistor, wherein a first terminal of the second transistor is arranged to receive the second supply voltage, a second terminal of the second transistor is connected to the first node, and a control terminal of the second transistor is arranged to receive the second clock, wherein the first transistor and the second transistor are configured to collaboratively operate as a first transmission gate.

8. The level shifting circuit as claimed in claim 7, wherein the footer switch comprises:

a third transistor, wherein a first terminal of the third transistor is connected to the second node, a second terminal of the third transistor is arranged to receive the ground voltage, and a control terminal of the third transistor is arranged to receive the first clock; and a fourth transistor, wherein a first terminal of the fourth transistor is connected to the second node, a second terminal of the fourth transistor is arranged to receive the ground voltage, and a control terminal of the fourth transistor is arranged to receive the second clock, wherein the third transistor and the fourth transistor are configured to collaboratively operate as a second transmission gate.

9. The level shifting circuit as claimed in claim 3, wherein the converter comprises:

a first transistor, wherein a first terminal of the first transistor is connected to a third node, a second terminal of the first transistor is connected to the second node, and a control terminal of the first transistor is arranged to receive the input signal;

a second transistor, wherein a first terminal of the second transistor is connected to a fourth node, a second terminal of the second transistor is connected to the second node, and a control terminal of the second transistor is arranged to receive the inverted signal;

a third transistor, wherein a first terminal of the third transistor is connected to the first node, and a control terminal of the third transistor is connected to the fourth node;

a fourth transistor, wherein a first terminal of the fourth transistor is connected to a second terminal of the third transistor, a second terminal of the fourth transistor is connected to the third node, and a control terminal of the fourth transistor is arranged to receive the input signal;

a fifth transistor, wherein a first terminal of the fifth transistor is connected to the first node, and a control terminal of the fifth transistor is connected to the third node; and a sixth transistor, wherein a first terminal of the sixth transistor is connected to a second terminal of the fifth transistor, a second terminal of the sixth transistor is connected to the fourth node, and a control terminal of the sixth transistor is arranged to receive the inverted signal, wherein the third node is the output terminal of the front stage.

10. The level shifting circuit as claimed in claim 3, further comprising:

an inverter, wherein a first power terminal of the inverter is arranged to receive the first supply voltage, a second power terminal of the inverter is arranged to receive the ground voltage, an input terminal of the inverter is arranged to receive the input signal, and an output terminal of the inverter is arranged to generate the inverted signal.

11. The level shifting circuit as claimed in claim 1, wherein the rear stage comprises:

a first inverter, wherein a first power terminal of the first inverter is arranged to receive the second supply voltage, a second power terminal of the first inverter is arranged to receive the ground voltage, an input terminal of the first inverter is connected to the output terminal of the front stage, and an output terminal of the first inverter is arranged to generate the output signal;

a second inverter, wherein a first power terminal of the second inverter is arranged to receive the second supply voltage, a second power terminal of the second inverter is arranged to receive the ground voltage, and an input terminal of the second inverter is connected to the output terminal of the first inverter; and a transmission gate, wherein a first terminal of the transmission gate is connected to an output terminal of the second inverter, a second terminal of the transmission gate is connected to the input terminal of the first inverter, a first clock terminal of the transmission gate is arranged to receive the first clock, and a second clock terminal of the transmission gate is arranged to receive the second clock, wherein during the first phase, the transmission gate is turned off, and the first inverter is arranged to generate the output signal according to the shifted signal, wherein during the second phase, the transmission gate is turned on, and the first inverter and the second inverter are configured to collaboratively operate as the latch.

12. The level shifting circuit as claimed in claim 11, wherein the transmission gate comprises:

a first transistor, wherein a first terminal of the first transistor is connected to the output terminal of the second inverter, a second terminal of the first transistor is connected to the input terminal of the first inverter, and a control terminal of the first transistor is arranged to receive the first clock; and a second transistor, wherein a first terminal of the second transistor is connected to the output terminal of the second inverter, a second terminal of the second transistor is connected to the input terminal of the first inverter, and a control terminal of the second transistor is arranged to receive the second clock.

13. The level shifting circuit as claimed in claim 1, wherein the rear stage comprises:

an inverter, wherein a first power terminal of the inverter is arranged to receive the second supply voltage, a second power terminal of the inverter is arranged to receive the ground voltage, an input terminal of the inverter is connected to the output terminal of the front stage, and an output terminal of the inverter is arranged to generate the output signal;

a header switch, wherein a first terminal of the header switch is arranged to receive the second supply voltage, a second terminal of the header switch is connected to a first node, and a control terminal of the header switch is arranged to receive the second clock;

a footer switch, wherein a first terminal of the footer switch is connected to a second node, a second terminal of the footer switch is arranged to receive the ground voltage, and a control terminal of the footer switch is arranged to receive the first clock;

a first transistor, wherein a first terminal of the first transistor is connected to the first node, a second terminal of the first transistor is connected to the input terminal of the inverter, and a control terminal of the first transistor is connected to the output terminal of the inverter; and a second transistor, wherein a first terminal of the second transistor is connected to the input terminal of the inverter, a second terminal of the second transistor is connected to the second node, and a control terminal of the second transistor is connected to the output terminal of the inverter, wherein during the first phase, the header switch and the footer switch are turned off, and the inverter is arranged to generate the output signal according to the shifted signal, wherein during the second phase, the header switch and the footer switch are turned on, and the rear stage is configured to operate as the latch.

14. The level shifting circuit as claimed in claim 13, wherein the header switch comprises a third transistor, wherein a first terminal of the third transistor is arranged to receive the second supply voltage, a second terminal of the third transistor is connected to the first node, and a control terminal of the third transistor is arranged to receive the second clock.

15. The level shifting circuit as claimed in claim 14, wherein the footer switch comprises a fourth transistor, wherein a first terminal of the fourth transistor is connected to the second node, a second terminal of the fourth transistor is arranged to receive the ground voltage, and a control terminal of the fourth transistor is arranged to receive the first clock.

16. The level shifting circuit as claimed in claim 13, wherein the header switch comprises:

a third transistor, wherein a first terminal of the third transistor is arranged to receive the second supply voltage, a second terminal of the third transistor is connected to the first node, and a control terminal of the third transistor is arranged to receive the first clock; and a fourth transistor, wherein a first terminal of the fourth transistor is arranged to receive the second supply voltage, a second terminal of the fourth transistor is connected to the first node, and a control terminal of the fourth transistor is arranged to receive the second clock, wherein the third transistor and the fourth transistor are configured to collaboratively operate as a first transmission gate.

17. The level shifting circuit as claimed in claim 16, wherein the footer switch comprises:

a fifth transistor, wherein a first terminal of the fifth transistor is connected to the second node, a second terminal of the fifth transistor is arranged to receive the ground voltage, and a control terminal of the fifth transistor is arranged to receive the first clock; and a sixth transistor, wherein a first terminal of the sixth transistor is connected to the second node, a second terminal of the sixth transistor is arranged to receive the ground voltage, and a control terminal of the sixth transistor is arranged to receive the second clock, wherein the fifth transistor and the sixth transistor are configured to collaboratively operate as a second transmission gate.

* * * * *